United States Patent
Florea et al.

(10) Patent No.: US 8,782,501 B2
(45) Date of Patent: *Jul. 15, 2014

(54) ERROR CORRECTION ENCODING METHOD, DECODING METHOD AND ASSOCIATED DEVICES

(75) Inventors: Alina Alexandra Florea, Montigny le Bretonneux (FR); Hang Nguyen, Bretigny sur Orge (FR); Laurent Martinod, Le Chesnay (FR); Christophe Molko, Villepreux (FR)

(73) Assignee: Cassidian SAS, Elancourt (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/004,799

(22) PCT Filed: Mar. 14, 2012

(86) PCT No.: PCT/EP2012/054494
§ 371 (c)(1),
(2), (4) Date: Sep. 12, 2013

(87) PCT Pub. No.: WO2012/123511
PCT Pub. Date: Sep. 20, 2012

(65) Prior Publication Data
US 2014/0006910 A1  Jan. 2, 2014

(30) Foreign Application Priority Data

Mar. 15, 2011 (FR) ...................... 11 52106

(51) Int. Cl.
*H03M 13/03* (2006.01)
*H03M 13/29* (2006.01)
*H03M 13/27* (2006.01)
*H03M 13/23* (2006.01)

(52) U.S. Cl.
CPC .............. *H03M 13/29* (2013.01); *H03M 13/27* (2013.01); *H03M 13/2957* (2013.01); *H03M 13/23* (2013.01)
USPC ....................................................... 714/786

(58) Field of Classification Search
CPC ...... H03M 13/29; H03M 13/27; H03M 13/23; H03M 13/2957; H03M 13/35
USPC ........................................... 714/786; 375/261
See application file for complete search history.

(56) References Cited

U.S. PATENT DOCUMENTS 5,446,747 A   8/1995  Berrou

FOREIGN PATENT DOCUMENTS

WO          96/32781       10/1996

OTHER PUBLICATIONS

Frank Burkert et al., "'Turbo' Decoding with Unequal Error Protection Applied to GSM Speech Coding", Global Telecommunications Conference, vol. 3, Nov. 18, 1996, pp. 2044-2048.

(Continued)

*Primary Examiner* — Shelly A Chase
(74) *Attorney, Agent, or Firm* — Greer, Burns & Crain, Ltd.

(57) ABSTRACT

An error correction encoding method is provided for encoding in parallel source digital data, having the form of a frame, wherein said data can be classified into N classes, where N is an integer at least equal to 2.

The encoding method includes:
  a first recursive systematic convolutional encoding step of data to be encoded, formed by the data of the class 1; and
  an implementation of the following steps, for each n ranging from 1 to M, where M is a positive integer equal to or lower than N−1:
    $n^{th}$ mixing of a set formed by the data of the class n+1 and the systematic data of the preceding encoding; and
    $(n+1)^{th}$ recursive systematic convolutional encoding of data to be encoded, formed by the result of the $n^{th}$ mixing.

Also disclosed is a related decoding method, as well as an associated encoding and decoding devices.

14 Claims, 3 Drawing Sheets

(56) References Cited

OTHER PUBLICATIONS

Sergio Benedetto et al., "Soft-Input Soft-Output Modules for the Construction and Distributed Iterative Decoding of Code Networks", European Transactions on Telecommunications, vol. 9, No. 2, Mar. 1, 1998, pp. 155-172.

Ralph Jordan et al., "Woven Convolutional Codes and Unequal Error Protection", ISIT, Washington, D.C. Jun. 24-29, 2001, p. 299.

Du Peng et al., "Woven Convolutional Codes and a New Iterative Decoding Algorithm", IEEE International Symposium on Personal, Indoor and Mobile Radio Communication Proceedings, 2003, pp. 1873-1875.

ERROR CORRECTION ENCODING METHOD, DECODING METHOD AND ASSOCIATED DEVICES

TECHNICAL FIELD

The present invention relates to an error correction encoding method.

It also relates to a decoding method adapted to decode data that have been encoded using the error correction encoding method according to the invention.

It also relates to an encoding device for implementing the error correction encoding method according to the invention, as well as a decoding device for implementing the decoding method according to the invention.

The field of the invention is that of encoding digital data, for being transmitted in particular in the presence of a transmission noise, and of decoding said digital data after transmission.

The invention more particularly but in a non-limiting way relates to the field of optimization of digital data transmission, for example via a wide band radio network.

BACKGROUND

In telecommunications, error correction encoding methods (also called Forward Error Correction (FEC)) are used to protect so-called source data to be transmitted, from errors that will come from the transmission. To do this, redundancy is added to the source data in order to enable the recipient to detect and correct part of the errors.

The error correction encoding is followed with a modulation for transmission, that is why generally, the modulation and coding scheme (MCS) is used to designate both the error correction encoding and the modulation.

In prior art is known an error correction encoding method commonly called "turbo code". This is an error correction encoding method, implementing in parallel at least two independent steps of systematic convolutive encoding of all the data to be encoded, and at least one time interleaving step changing the order for taking into account data for each of the encoding steps. Turbo codes are for example presented in French patent FR2675971. The decoding implements an iterative decoding algorithm based on the Bahl, Cocke, Jelinek and Raviv algorithm and an a posteriori maximum search.

One drawback of turbo codes however is that all the source data are equally protected.

UEP (Unequal Error Protection) codes, born with GSM technology, bring a response to this drawback by enabling digital data of a frame to be gathered into different classes depending on their importance, and each class to be protected depending on its priority level (a priority level all higher is assigned as the datum is important).

This principle enables transmission resources as well as the frequency band width used to be optimized.

A known drawback of UEP codes is that each class is separately processed. The different classes are first separated, and then separately encoded. The encoded data of each class are then separately modulated. After transmission, the data of a same frame are thus decorrelated. This involves a resource loss because there is for example a need for:
further headers (that is further data used for defining a data packet, for example the data of a class in the case where the different classes are independently processed), and
further processings to resynchronize the data from different classes of a same frame after transmission.

Further, this resynchronization steps generate reception delays.

Such a resource loss goes against the current demand for a higher transmission rate, higher network capacity and shorter transmission delay.

SUMMARY

One purpose of the present invention is to provide error correction encoding/decoding methods and devices which do not have the drawbacks of prior art.

Another purpose of the present invention is to provide error correction encoding/decoding methods and devices which minimize the transmission and reception delays, in particular for applications such as sound or video transmission.

Another purpose of the present invention is to provide error correction encoding/decoding methods and devices which are less resource-heavy than the methods and devices of prior art.

Another purpose of the present invention is to provide error correction encoding/decoding methods and devices which require fewer transmission rates than the methods and devices of prior art.

Finally, one purpose of the present invention is to provide error correction encoding/decoding methods and devices which require less network capacity than the methods and devices of prior art.

The invention enables at least one of these purposes to be achieved by an error correction encoding method for encoding in parallel so-called source digital data, having the form of a frame, wherein said data can be classified in N classes, where N is an integer equal to at least 2.

The encoding method according to the invention comprises:
a first recursive systematic convolutional encoding step of data to be encoded, formed by the data of the class 1; and
an implementation of the following steps, for each n ranging from 1 to M, where M is a positive integer equal to or lower than N−1
$n^{th}$ mixing of a set formed by the data of the class n+1 and the systematic data of a preceding encoding;
$(n+1)^{th}$ recursive systematic convolutional encoding of data to be encoded, formed by the result of the $n^{th}$ mixing.

Several intermediate encoding steps of the same data can also be provided before adding new information to be encoded.

A $n^{th}$ mixing of a set formed by the data of the class n+1 and the systematic data of the preceding encoding step is thus referred to because
the preceding encoding step can be the encoding step n;
the preceding encoding step can be an intermediate encoding step.

The term "systematic datum", as well as the term "parity datum" used in the following, are terms relating to recursive systematic convolutional codes, and are known to those skilled in the art. They correspond to two outputs of a recursive systematic convolutional code.

Throughout the text, the systematic data and parity data can comprise tail bits.

The systematic datum is preferably identical to the datum to be encoded, whereas the parity datum can correspond to at least one redundancy datum.

The systematic data of an encoding step form the data to be encoded by said encoding step.

The invention advantageously provides adding new information to be encoded before some encoding steps.

Thus, a UEP type error correction encoding method is performed, that is with a non-uniform protection, wherein each class can benefit from a different protection with respect to errors occurring in particular during a transmission on a channel.

The invention takes up the general principle of turbo codes, since there are successive encoding steps and mixing steps in view of a further encoding of the same data. However, the known scheme has been changed to result in an encoding scheme wherein different source digital data of a same frame are more or less protected.

The different protection comes from a different number of redundancy information (or encoded data), as a function of the number of times the data of the class have been encoded.

Each class can indeed be encoded a different number of times, depending on a number of encodings performed taking into account the data of this class. The data of the class can be taken into account for an encoding, as data of the class 1, as data of the class n+1 and/or as data to be encoded formed by the result of the $n^{th}$ mixing.

The method according to the invention is adapted to process entire frames.

The data protection can be called hierarchical, wherein more important data, in other words with a higher priority level, can be better protected.

The structure can be adapted to any frame type, regardless in particular of the number of classes.

A UEP encoding is performed which is directly applicable to an entire frame of digital data.

Each class of a frame can thus be encoded with a dedicated encoding scheme different from the encoding scheme applied to one or more other classes of the same frame.

The method according to the invention thus enables an encoding to be performed with fewer resources than state of the art methods.

Besides, the method according to the invention enables a quicker encoding to be performed by consuming less power than state of the art methods and by reducing the reception delay of applications such as voice and video.

Finally, data encoded with the method according to the invention can be transmitted with fewer transmission rates and less network capacity than data encoded with prior art methods and devices, with an equal protection.

The method according to the invention enables the different classes of a same frame to be encoded by a single error correction encoding method, unlike known UEP encoding methods wherein each class is encoded independently from other classes of the same frame.

It is no longer necessary to separate data of different classes of a same frame into several data flows, to encode them separately.

The method according to the invention thus enables the transmission of synchronization information to be avoided, and thus the resources of the transmission network to be optimized.

The method according to the invention thus enables a reception delay to be reduced, in particular for applications such as sound (for example voice) or video transmission.

The method according to the invention thus enables a resynchronization step to be avoided after transmission.

The method according to the invention thus enables the modulation of data that have been encoded to be simplified, wherein all the classes of a frame can be modulated together. It enables a single modulation scheme to be applied.

The at least one mixing step can provide a random distribution of the digital data in the final result.

The digital data can be any digital datum, in particular digital data representing a video or a voice.

The encoding method is preferably followed by a suitable modulation adapted to the transmission channel used.

The encoding and modulation scheme that can then be obtained is particularly robust to errors.

Some data of the frame can be provided not to be encoded.

An implementation of the puncturing can be provided following the implementation of a coding step. This can involve at least one depuncturing step during a decoding. The depuncturing consists in retrieving data of the same size such as data before a corresponding puncturing, for example by introducing zeros in the punctured data.

Preferably, a priority level is assigned to each class, the classes 1 to N being ranked in the decreasing order of the priority levels.

The method according to the invention thus enables each class to benefit from an adapted protection. Thereby, it enables the transmission of more redundancy information than necessary to be avoided, which enables the resources of the transmission network to be optimized while obtaining an optimum reception quality, since the most important information have been highly protected.

Each mixing step can consist in a simple concatenation.

Advantageously, each mixing step consists in an interleaving.

An interleaving can consist in organizing received data non-contiguously. Any type of known interleaving can be considered, in particular interleavings developed within the scope of turbo codes.

Generally, errors during a transmission on a channel occur in bursts rather than independently. If the number of errors exceeds the capacity of the error correction encoding, it fails to recover the source data. The interleaving is generally used to aid in solving this problem by changing the order for taking into account same digital data in several encodings, thus creating a more uniform error distribution.

According to a preferred embodiment of the encoding method according to the invention, M is chosen equal to N−1, so that the classes 1 to N are encoded.

Thus, all the source digital data can be protected.

Preferably, at the end of the implementation of all the steps of the encoding method according to the invention, that is at the output, parity data are obtained corresponding to each of the encoding steps as well as a systematic datum corresponding to the $(M+1)^{th}$ encoding step.

The invention also relates to an encoding device for implementing the error correction encoding method according to the invention, capable of encoding so-called source digital data having the form of a frame, wherein said data can be classified into N classes. Said encoding device according to the invention comprises:

a first recursive systematic convolutional encoding module for encoding data to be encoded formed by the data of the class 1; and let n to range from 1 to M, wherein M is a positive integer equal to or lower than N−1, M sets each formed by a $n^{th}$ mixer followed by a $(n+1)^{th}$ recursive systematic convolutional encoding module, the $n^{th}$ mixer being arranged to receive the data of the class n+1 and the systematic data of a preceding encoding module, and the $(n+1)^{th}$ encoding module being arranged to encode data to be encoded formed by the output of the $n^{th}$ mixer.

The invention also relates to a method for decoding digital data, arranged to decode digital data encoded in accordance with the encoding method of the invention.

Preferably, at the end of the implementation of all the steps of the encoding method according to the invention, parity data are obtained corresponding to each of the encoding steps, as well as the systematic datum of the $(M+1)^{th}$ encoding step.

These obtained data are advantageously transmitted via a transmission channel.

So-called received data that may be affected by errors occurring in particular during the transmission can therefore be received after transmission.

Advantageously, the decoding method according to the invention is applied to such received data.

For reasons of clarity of the description, a datum before and after transmission is designated in the same way throughout the text.

Particularly advantageously, the decoding method according to the invention is such that, for any j, k, l between M+1 and 1:

each $j^{th}$ encoding step of the encoding method according to the invention, corresponds to a decoding step j ($410_j$), adapted to decode encoded data resulting from the $j^{th}$ encoding step;

at the end of each decoding step j, on the one hand so-called "soft" data are obtained for an assessment of the data of the class j, on the other hand so-called extrinsic data are obtained;

and the following steps are implemented:

decoding k; and then decoding l≠k as a function of at least one extrinsic datum provided by at least one other decoding step, used as an a priori datum.

So-called "a priori" data preferably represent probabilities on encoded data received from the channel.

These probabilities are available before any current decoding of said encoded data received, these probabilistic values coming from a source different from the encoded data received from the channel.

An a priori datum used to decode the encoded data resulting from the $k^{th}$ encoding step can be relating to the parity data and systematic data of this $k^{th}$ encoding step The extrinsic data of a bit B advantageously designate the information produced by a decoder (based on the encoded information received from the channel and, if applicable, a priori data), except for the channel and a priori information of the bit B concerned.

These extrinsic data can represent the probability to have received this bit B as a function of values of all the other adjacent bits of the same frame.

The following book can in particular be referred to: Todd K Moon, "Error Correction Coding—Mathematical Methods and Algorithms", John Wiley & Sons 2005.

The extrinsic data resulting from the $j^{th}$ encoding step are preferably relating to the parity data and systematic data of this $j^{th}$ encoding step.

The extrinsic data preferably comprise so-called "a priori" data providing a further datum for assessing the data of other classes.

At each decoding step, an a priori datum can be used.

For the decoding step performed first in the chronological order, the a priori datum is set to zero. Then, each decoding step enables an a priori datum used for another decoding step to be obtained.

Each class can benefit from a different protection with respect to errors. A strongly protected class will benefit from an error rate all the less significant upon decoding.

A decoding l≠k as a function of at least one extrinsic datum provided by least one other decoding step, used as an a priori datum, enables the different encoded classes to benefit from the encoding of the other encoded classes.

A given bit error rate can thus be more quickly achieved for a less protected class. The invention thereby allows energy, redundancy, and delay savings.

Each decoding step can implement an iterative decoding, that is any type of algorithm based on the a posteriori maximum (MAP) search for assessing a posteriori probabilities. This a posteriori maximum can be calculated with the BCJR algorithm (Bahl, Cocke, Jelinek and Raviv algorithm), with a MAP derivation, in particular according to a so-called LOG MAP decoding using a likelihood ratio ("Log Likelihood Probabilities Ratios"), or a so-called MAX LOG MAP decoding, more suitable for the hardware implementation.

Before their use as an a priori datum for a decoding step j, the extrinsic data can be processed. The aim is to retrieve data of the same dimension and in the same order as the data at the output of the corresponding encoding step.

Preferably, the data assessments of the data of each class are gradually extracted from the soft data. The aim is to extract at the right moment some data relating to the respective classes.

A decoding step can be performed non successively for any class, regardless of the encoding order.

The first encoding step can be performed for an intermediate class, and the preceding and following decoding steps can be performed in any advantageous order, in particular according to a preset error rate to be achieved for each class.

Advantageously, a decoding step can be successively performed for all the classes n, where n is decreasing, ranging from M+1 to 1.

Preferably, the decoding method according to the invention further comprises an initial demultiplexing step performing the separation of the parity data of each class.

The parity data of each class can then each be used for a corresponding decoding step.

For any j between M+1 and 2, the decoding method according to the invention can further comprise after each decoding step j, the following operations:

disentangling j−1 of the so-called extrinsic data, the disentangling j−1 performing a function reverse to that implemented in the mixing step j−1, for providing disentangled data;

demultiplexing the disentangled data to separate a priori data relating to the class j called extracted data from a priori data relating to the classes 1 to j−1 called useful a priori data;

providing said useful a priori data to be used in the decoding step j−1.

Throughout the text, when disentangling is mentioned to, it refers to a given mixing, the disentangling consisting in retrieving the order of the data before said mixing.

For any j between M+1 and 2, the decoding method according to the invention can further comprise after each decoding step j, the following operations:

disentangling j−1 of the soft data, the disentangling j−1 performing a function reverse to that implemented in the mixing step j−1, to provide disentangled soft data;

demultiplexing the disentangled soft data to separate soft data relating to the class j called extracted soft data from soft data relating to the classes 1 to j−1.

The extracted soft data are used for assessing the data of the class j.

A specific step for assessing the extracted soft data can further be provided to retrieve the values of the class j.

At least one decoding step j can be reiterated at least once, as a function of a priori data corresponding to extrinsic data provided by at least one decoding step of the data of another class.

At each reiteration of a decoding step, one a priori datum can be used.

Each decoding step can be reiterated at least once, for example between 1 and 5 times.

Thus reiterated decoding step can then be followed by new decoding steps of data from following or preceding classes.

Before their use for a reiteration of the decoding step j, the extrinsic data can be processed before using some of them at least as a priori data. The aim is to retrieve data of the same dimension and in the same order as the data at the output from the corresponding encoding step.

At least one feedback is thus performed. The decoding method according to the invention can thus be considered as iterative, wherein each new iteration of a decoding step can improve the assessment of the data of the corresponding class.

Information from other classes can thus be used to improve the decoding of a class.

Each class benefits from a different protection with respect to errors. A strongly protected class will benefit from an error rate all the less important during decoding. During decoding, the at least one feedback enables to exploit the fact that during encoding, data corresponding to each of the classes are mixed. The different encoded classes can thereby benefit from the encoding of the other encoded classes.

A given bit error rate can thus be more quickly reached, for a less protected class. The invention thus allows energy, bit redundancy and transmission delay savings.

At least one decoding step j can be reiterated at least once as a function of a priori data corresponding to extrinsic data provided by at least one decoding step of the data of another class, and for j between M+1 and 2, and t strictly lower than j, the decoding step j is reiterated as a function of a priori data obtained in the decoding steps t to j−1.

Each decoding step can thus be reiterated using a priori data obtained in decoding steps of classes with higher priority.

In this case, said a priori data can comprise extrinsic information relating to the classes 1 to j−1 and information relating to the parity data of the classes 1 to j−1.

The decoding steps j−1 to t can then be reiterated.

At least one decoding step j can be reiterated at least once as a function of a priori data corresponding to extrinsic data provided by at least one decoding step of the data of another class, and for j between M and 1 and t strictly higher than j, the decoding step j is reiterated as a function of a priori data obtained in the decoding steps t to j+1.

Each decoding step can thus be reiterated using a priori data obtained in decoding steps of classes with a lower priority.

In this case, said a priori data can comprise extrinsic information relating to the classes t to j+1 and information relating to the parity data of the classes t to j+1.

The decoding steps j+1 to t can then be reiterated.

Preferably, the decoding method according to the invention comprises the following steps:
the decoding step M+1 is reiterated as a function of a priori data obtained in the decoding steps 1 to M;
the decoding steps M to 1 are reiterated using a priori data corresponding to extrinsic data provided by the preceding decoding step (following the chronological order), so that the decoding steps M+1 to 1 make up a decoding phase; and the decoding phase is reiterated at least once.

Thus, a feedback is performed on all the decoding steps, and in each decoding phase, the decoding steps are successively performed for all the classes n, where n is decreasing, ranging from M+1 to 1.

From the second iteration, the decoding step M+1 can be performed as a function of extrinsic data provided by the decoding step 1.

Information from all the other classes can thus be used to improve the decoding of a class.

The invention also relates to a decoding device adapted to implement the decoding method according to the invention.

The decoding device according to the invention comprises M+1 decoding modules, each decoding module j (where j is an integer between 1 and M+1 inclusive) being capable of decoding encoded data resulting from the $j^{th}$ encoding step of the encoding method according to the invention, and each decoding module j providing so-called extrinsic data capable of being used as a priori data by another decoding module, and at least one so-called "soft" datum for an assessment of the data of the class j.

The invention finds an application in all the fields of data transmission and any transmission system, whether it is a wire or a wireless transmission. It can be in particular the field of:
terrestrial radio communications,
aerospace radio communications,
data transmission in robotics or electronics,
audio and/or video applications.

The invention also relates to a computer program product comprising instructions to perform the steps of the encoding method according to the invention when run on a computer device.

The invention also relates to a computer program product comprising instructions to perform the steps of the decoding method according to the invention when run on a computer device.

BRIEF DESCRIPTION OF THE DRAWINGS

Further advantages and features of the invention will appear upon reading the detailed description of the implementations and embodiments in no way limiting, and of the following appended drawings wherein.

DETAILED DESCRIPTION

Throughout the text, a multiplexing can designate a concatenation, an interleaving or any other operation performed to rank data in a one-dimensional or multidimensional frame.

Throughout the text, when demultiplexing is mentioned to, it refers to a given multiplexing, the demultiplexing being the reverse operation of said multiplexing.

Throughout the text, when deinterleaving is mentioned to, it refers to a given interleaving, the deinterleaving consisting in retrieving the order of data before said interleaving.

The means for implementing each step of the method according to the invention are known to those skilled in the art, consequently only exemplary methods according to the invention will be described in detail.

Figure 1:
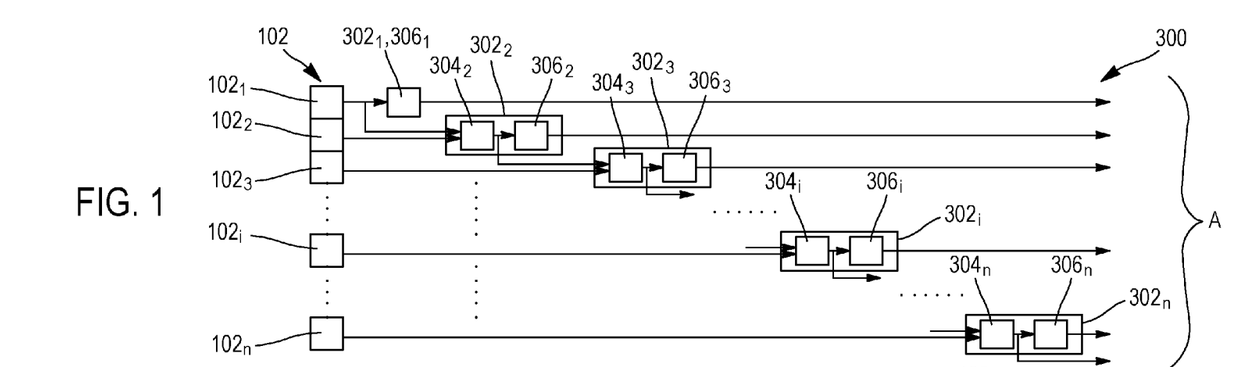
FIG. 1 diagrammatically illustrates an example of the so-called "in parallel" encoding method according to the invention, FIG. 2 diagrammatically illustrates an example of the so-called "in parallel" decoding method according to the invention.

FIG. 1 is a diagram representation of an example of a parallel encoding method in accordance with the method according to the invention.

Each encoder implements a recursive systematic convolutional code.

In the example represented in FIG. 1, a data frame 102 is encoded. The data of the frame 102 are classified in n classes $102_1$-$102_n$. Each of the classes $102_i$ is associated with a priority level. In the present example, in a non-limiting way, the priority level of the class $102_1$ is greater than the priority level of the class $102_2$, and so on, the class with the lowest priority level being the class $102_n$.

Figure 3:
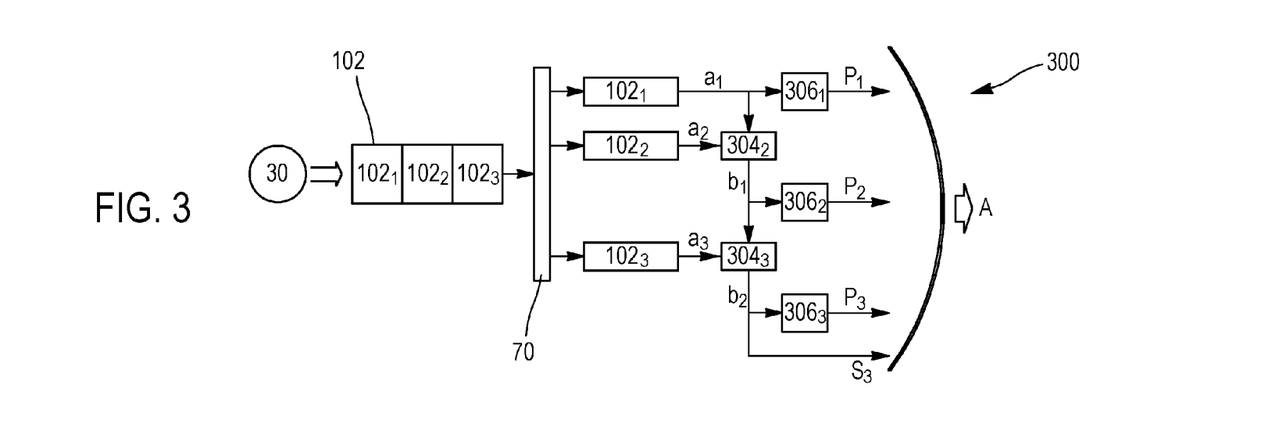
FIG. 3 illustrates a particular embodiment of the so-called "in parallel" encoding method according to the invention.

The method 300, represented in FIG. 3, comprises a first coding step $302_1$ which is limited to the encoding $306_1$ of the data of the class $102_1$.

This coding step $302_1$ outputs parity data which are redundancy data to enable the input data (and so-called systematic data which correspond to the input data) to be retrieved.

This step $302_1$ is followed by a second coding step $302_2$ performing an interleaving $304_2$ of the data of the class $102_1$ with the data of the class $102_2$.

The term "followed" is used, even though each coding step i can be performed simultaneously, before or after the encoding $306_{i-1}$.

The coding step $302_2$ comprises an encoding $306_2$ of the interleaved data provided by the interleaving $304_2$.

This coding step $302_2$ outputs parity data which are redundancy data to enable the input data (and so-called systematic data which correspond to the input data) to be retrieved.

The method 100 comprises after step $302_2$, a coding step $302_3$ and so on up to the step $302_n$. Each of the steps $302_i$ for i≥3 comprises the following operations:

an interleaving $304_i$ of the systematic data provided in step $302_{i-1}$, with the source data of the class $102_i$; and
an encoding $306_i$ of the interleaved data provided by the interleaving $304_i$.

Each step $302_i$ for i≥2 outputs the parity data and systematic data which here correspond to the interleaved data obtained in the interleaving $304_i$.

In output, the encoded frame A is obtained by multiplexing the parity data provided in each step $302_{i,\ i=1...n}$, and the systematic datum provided by step $302_n$.

It is noted that each interleaving step $304_{i+1}$, can also be implemented at the same time as the encoding step $306_i$.

The data of the frame 102 are modulated and transmitted together as the data A, because they are not separated prior to the implementation of the encoding method according to the invention.

The data A are preferably modulated and then transmitted on a transmission channel.

After transmission, the data A that can be affected by errors are received.

Figure 2:
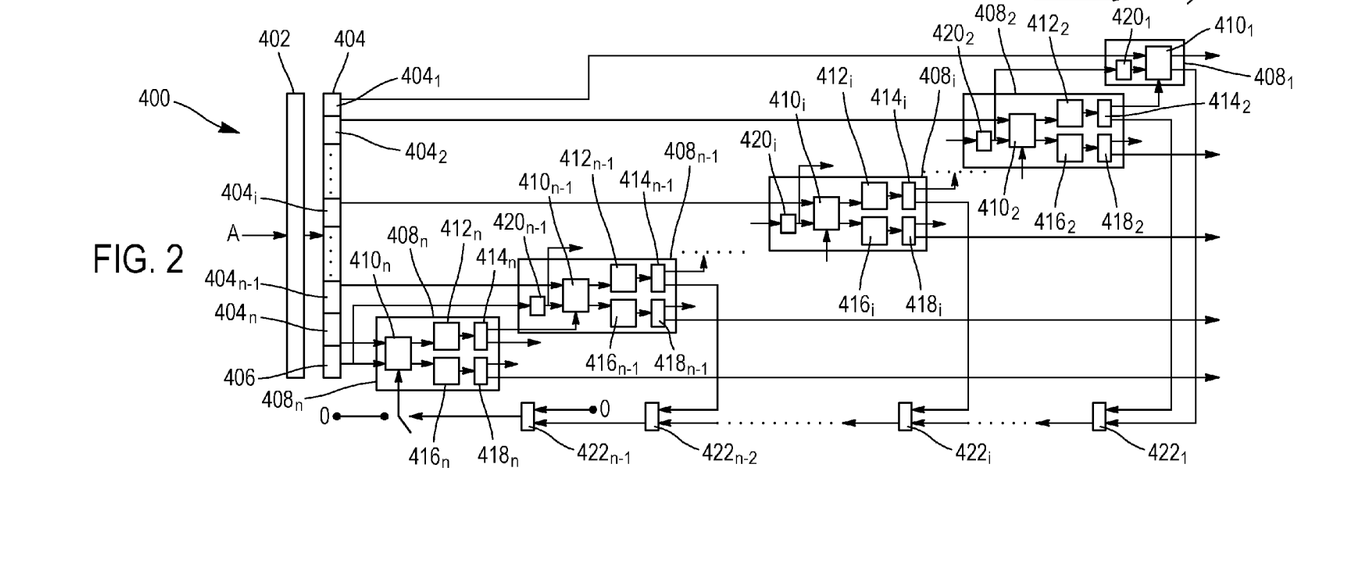

FIG. 2 is a diagram representation of an example of a "in parallel" decoding method 400 in accordance with the method according to the invention, in the case where each encoder implements a recursive systematic convolutional code.

In the example represented in FIG. 2, data A are decoded. These data A have been encoded in accordance with the parallel encoding method 300 according to the invention.

After each encoding, a puncturing can be provided to be further performed. In this case, the decoding comprises depuncturing steps. This particular case is not represented here, but it is not excluded from the field of the invention.

The method 400 comprises a preliminary demultiplexing step 402 enabling to separate from data A, the parity data $404_{1 \to n}$ obtained respectively at the encoding steps $306_{1 \to n}$ of the parallel encoding method 300, and the so-called systematic datum 406 corresponding to data to be encoded at the last encoding step of the parallel encoding method 300.

A first decoding step $408_n$ of the data of the class $102_n$ comprises the following steps:

a decoding $410_n$ of the parity data $404_n$ of the class $102_n$, using the systematic datum 406 and an a priori datum (initially equal to zero), and providing so-called extrinsic data as well as so-called soft data for assessing the data of the class $102_n$;
a deinterleaving $412_n$ of the so-called extrinsic data, to provide deinterleaved data, the deinterleaving $412_n$ implementing a interleaving function reverse to the interleaving function implemented in the interleaving $304_n$ of the parallel encoding method 300;
a demultiplexing $414_n$ of the deinterleaved data to separate so-called useful a priori data which will be used in the following decoding step, and so-called a priori data relating to the data of the class $102_n$.

The soft data for assessing the data of the class $102_n$ undergo a deinterleaving step $416_n$ implementing an interleaving function reverse to the interleaving function implemented in the interleaving $304_n$ of the parallel encoding method 300. A demultiplexing step $418_n$ enables probabilities for the data of the class $102_n$ (for each bit, probability to be 0 or 1) to be isolated. A step for assessing the data of the class $102_n$ can further be provided.

The demultiplexing $414_n$ is followed by a new decoding step $408_{n-1}$ of the data of the class $102_{n-1}$ comprising the following steps:

a decoding $410_{n-1}$ of the parity data of the class $102_{n-1}$, using:
the useful a priori data obtained in the preceding decoding step, and
an assessed channel datum (the parity and the systematic data for the recursive systematic convolutional codes, the systematic one of which being formed by the systematic datum of the preceding decoding step that underwent a deinterleaving step $420_{n-1}$ implementing an interleaving function reverse to the interleaving function implemented in the interleaving $304_n$ of the parallel encoding method 300 and after removal of the systematic data corresponding to the class $102_n$ therefrom).

The decoding $410_{n-1}$ provides so-called extrinsic data corresponding to the classes $102_{1 \to n-1}$ and data for assessing the data of the class $102_{n-1}$.

The decoding step $408_{n-1}$ then comprises the following steps:

a deinterleaving $412_{n-1}$ of the so-called extrinsic data, to provide deinterleaved data, the deinterleaving $412_{n-1}$ implementing an interleaving function reverse to the interleaving function implemented in the interleaving $304_{n-1}$ of the parallel encoding method 300;
a demultiplexing $414_{n-1}$ of the deinterleaved data to separate so-called useful a priori data relating to the data of the classes $102_{1 \to n-2}$ which will be used in the following decoding step, from so-called a priori data relating to the data of the class $102_{n-1}$.

The soft data for assessing the data of the class $102_{n-1}$ undergo a deinterleaving step $416_{n-1}$ implementing an interleaving function reverse to the interleaving function implemented in the interleaving $304_{n-1}$ of the parallel encoding method 300. A demultiplexing step $418_{n-1}$ enables probabilities for the data of the class $102_{n-1}$ (for each bit, probability to be 0 or 1) to be isolated. A step for assessing data of the class $102_{n-1}$ can further be provided.

The method 300 comprises after the step $408_{n-1}$, a decoding step $408_{n-2}$ and so on up to the step $408_2$. Each step $408_i$ for n−2≥i≥2 comprises the following operations:

a decoding $410_i$ of the parity data of the class $102_i$, using:
  the useful a priori data obtained in the preceding decoding step, and
  an assessed channel datum (formed by the parity and the systematic data for recursive systematic convolutional codes, the systematic one of which being formed by the systematic datum of the preceding decoding step that underwent a deinterleaving step $420_i$ implementing an interleaving function reverse to the interleaving function implemented in the interleaving $304_{i+1}$ of the parallel encoding method 300 and after removal of the systematic data corresponding to the classes $102_{i+1 \to n}$ therefrom).

The decoding step $410_i$ provides so-called extrinsic data and data for assessing the data of the class $102_i$, called soft data.

The decoding step $408i$ then comprises the following steps:
  a deinterleaving $412_i$ of the so-called extrinsic data, to provide deinterleaved data, the deinterleaving $412_i$ implementing an interleaving function reverse to the interleaving function implemented in the interleaving $304_i$ of the parallel encoding method 300;
  a demultiplexing $414_i$ of the deinterleaved data to separate so-called useful a priori data relating to the data of the classes $102_{1 \to i-1}$ which will be used in the following decoding step, from so-called a priori data relating to the data of the class $102_i$.

Data for assessing the data of the class $102_i$ undergo a deinterleaving step $416_i$ implementing an interleaving function reverse to the interleaving function implemented in the interleaving $304_i$ of the parallel encoding method 300. A demultiplexing step $418_i$ enables probabilities for data of the class $102_i$ (for each bit, probability to be 0 or 1) to be isolated. A step for assessing data of the class $102_i$ can further be provided.

The method 400 comprises after the step $408_2$, a decoding step $408_1$ comprising the following steps:
  a decoding $410_1$ of the parity data $404_1$ of the class $102_1$, using:
    the useful a priori data obtained in the preceding decoding step, and
    an assessed channel datum (formed by the parity and the systematic data for the recursive systematic convolutional codes, the systematic one of which being formed by the systematic datum of the preceding decoding step that underwent a deinterleaving step $420_1$ implementing an interleaving function reverse to the interleaving function implemented in the interleaving $304_2$ of the parallel encoding method 300 and after removal of the systematic data corresponding to the classes $102_{2 \to n}$ therefrom).

The decoding $410_1$ provides so-called extrinsic data and data corresponding to an assessment of the data of the class $102_1$, called soft data.

The steps described since the decoding $410_n$ are called decoding phase.

The decoding method 400 adapted to the parallel encoding also comprises a feedback, which consists in using extrinsic data provided in a decoding step to reiterate a preceding decoding step of the decoding phase.

The extrinsic data used for a reiteration of a decoding step are interleaved to retrieve data of the same dimension and in the same order as the data at the output from the corresponding encoding step.

The feedback comprises the following steps:
  interleaving $422_1$ of the extrinsic data provided by the decoding step $410_1$ and the so-called a priori data relating to the data of the class $102_2$, to obtain interleaved data provided by the interleaving $422_1$, the interleaving $422_1$ implementing an interleaving function similar to the interleaving function implemented in the interleaving $304_2$ of the parallel encoding method 300;
  for i ranging from 2 to n−2, i interleaving steps $422_i$ of the so-called a priori data relating to the data of the class $102_i$ and the interleaved data provided by the interleaving $422_{i-1}$, the interleaving $422_i$ implementing an interleaving function similar to the interleaving function implemented in the interleaving $304_{i+1}$ of the parallel encoded method 300;
  interleaving $422_{n-1}$ of the interleaved data provided by the interleaving $422_{n-2}$, with a datum of the size of the a priori data relating to the data of the class $102_n$ but set to zero, the interleaving $422_{n-1}$ implementing an interleaving function similar to the interleaving function implemented in the interleaving $304_n$ of the parallel encoding method 300;
  taking into account the interleaved data of the interleaving $422_{n-1}$ as an a priori datum during a second iteration of the decoding step $410_n$.

This second iteration of the decoding step $410_n$ can be followed by a third iteration of all the other steps of a decoding phase as described before.

Such a feedback can be implemented several times, for example three to fifteen times. After each iteration, the assessment of the data of each of the classes is improved. After at least five feedbacks, it is no longer always interesting to perform more feedbacks, since the gain on the assessment accuracy is negligible as compared to the further time required for another iteration A particular embodiment of the error correction encoding method 300 according to the invention will now be described in reference to FIG. 3.

Each encoding implements a recursive systematic convolutional code.

Such a code enables encoded data formed by so-called "parity" (redundancy) data and so-called "systematic" data (identical to the data to be encoded) to be obtained.

The so-called source digital data 30 are formed by a frame 102 comprising three classes $102_1$, $102_2$ and $102_3$.

The method 300 according to the invention comprises an initial step 70 of separating the data of each of the classes $102_1$, $102_2$ and $102_3$.

The data of the class $102_1$ are designated by the symbol $a_1$.
The data of the class $102_2$ are designated by the symbol $a_2$.
The data of the class $102_3$ are designated by the symbol $a_3$.

The method 300 according to the invention comprises a first encoding step $306_1$ of the data of the class $102_1$.

The parity data $P_1$, that is the redundancy data relating to the data $a_1$ are obtained.

The obtained data $P_1$ are called "parity of the class $102_1$".

The method 300 according to the invention then (or simultaneously) comprises a step $304_2$ of interleaving the data $a_1$ with the data $a_2$ of the class $102_2$.

Interleaved data $b_1$ are obtained.

The interleaved data $b_1$ are then encoded during an encoding step $306_2$, which provides parity data $P_2$, that is redundancy data relating to the data $b_1$.

Since data $b_1$ are formed by the mixed data $a_1$ and $a_2$, the number of available redundancy data corresponding to data $a_1$ is increased.

The obtained data $P_2$ are called "parity of the classes $102_1$ and $102_2$".

The method 300 according to the invention then (or simultaneously) comprises a step $304_3$ of interleaving the data $b_1$ with the data $a_3$ of the class $102_3$.

Interleaved data $b_2$ are obtained.

The interleaved data $b_2$ are then encoded during an encoding step $306_3$, which provides parity data $P_3$, that is redundancy data relating to the data $b_2$.

Since data $b_2$ are formed by the mixed data $a_1$, $a_2$ and $a_3$, the number of available redundancy data corresponding to data $a_1$ and $a_2$ is increased.

The obtained data $P_3$ are called "parity of the classes $102_1$, $102_2$ and $102_3$".

Data A gathering all the parities $P_1$, $P_2$ and $P_3$ are obtained in output, as well as a so-called systematic output $S_3$ corresponding to the data $b_2$ to be encoded during the last encoding step $306_3$. The systematic output is due to the use of recursive systematic convolutional codes.

Figure 4:
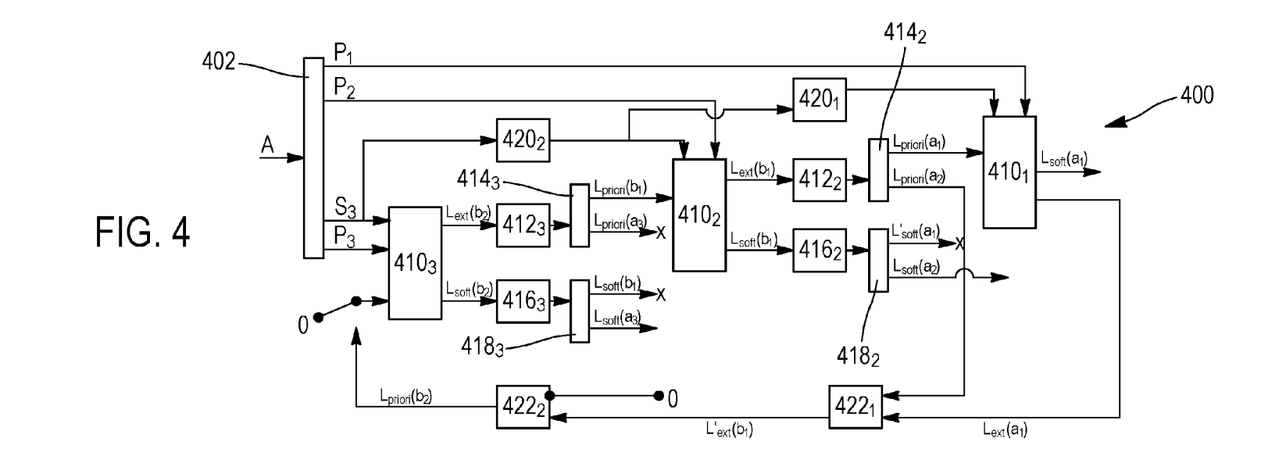
FIG. 4 illustrates a particular embodiment of the so-called "in parallel" decoding method according to the invention.

A particular embodiment of the decoding method 400 according to the invention will now be described in reference to FIG. 4, corresponding to the encoding method of FIG. 3, and in the case where each encoder implements a recursive systematic convolutional code.

A first demultiplexing step 402 enables the parities $P_1$, $P_2$, $P_3$ and the systematic output $S_3$ to be separated among the received data A.

The method 400 according to the invention comprises a first decoding comprising a decoding step $410_3$ of the parity $P_3$, as a function of the systematic output $S_3$ and an a priori datum initially set to zero.

An output $L_{soft}(b_2)$ and so-called extrinsic data $L_{ext}(b_2)$ are obtained.

The output $L_{soft}(b_2)$ enables data $b_2$ to be assessed.

Throughout the text, $L_{soft}$, $L_{ext}$ and $L_{priori}$ correspond to the logarithmic probabilities for each data bit to be 0 or 1, resulting from an advantageous use for this particular embodiment of the decoding algorithm called MAX LOG MAP.

On the one hand, the following steps are implemented:
deinterleaving $416_3$ of the output $L_{soft}(b_2)$, the deinterleaving $416_3$ implementing a deinterleaving function reverse of the interleaving function implemented in the interleaving step $304_3$;
demultiplexing $418_3$ to separate the $L_{soft}(a_3)$ and $L_{soft}(b_1)$ data.

The output $L_{soft}(a_3)$ corresponds to an assessment of the data $a_3$ of the class $102_3$.

The output $L_{soft}(b_1)$ corresponds to an assessment of the data $b_1$.

Indeed, the data $b_2$ correspond to the data $a_3$ interleaved with the data $b_1$.

So-called extrinsic data $L_{ext}(b_2)$ comprise in particular information relating to an assessment of the data of the class $102_3$.

On the other hand, the following steps are implemented:
deinterleaving $412_3$ of the output $L_{ext}(b_2)$, the deinterleaving $412_3$ implementing a deinterleaving function reverse of the interleaving function implemented in the interleaving step $304_3$;
demultiplexing $414_3$ to separate the $L_{priori}(a_3)$ and $L_{priori}(b_1)$ data.

The $L_{priori}(a_3)$ data correspond to the logarithmic probabilities for each data bit of the class $102_3$ to be 0 or 1.

The $L_{priori}(b_1)$ data are used as a priori information at the following decoding step.

The demultiplexing $414_3$ is followed by a second decoding comprising a decoding step $410_2$ of the parity $P_2$, as a function of $L_{priori}(b_1)$ and the systematic output $S_3$ at which a deinterleaving $420_2$ has been applied implementing a deinterleaving function reverse of the interleaving function implemented in the interleaving step $304_3$, and a demultiplexing to separate systematic information corresponding to the data $b_1$ and the data of the class $a_3$. Only the systematic data $b_1$ are useful for this decoding.

An output $L_{soft}(b_1)$ and so-called extrinsic data $L_{ext}(b_1)$ are obtained.

The output $L_{soft}(b_1)$ enables data $b_1$ to be assessed.

On the one hand, the following steps are implemented:
deinterleaving $416_2$ of the output $L_{soft}(b_1)$, the deinterleaving $416_2$ implementing a deinterleaving function reverse of the interleaving function implemented in the interleaving step $304_2$;
demultiplexing $418_2$ to separate the $L_{soft}(a_2)$ and $L'_{soft}(a_1)$ data.

The output $L_{soft}(a_2)$ corresponds to an assessment of the data $a_2$ of the class $102_2$.

The so-called extrinsic data $L_{ext}(b_1)$ comprise information relating to an assessment of the data of the classes $102_1$ and $102_2$.

On the other hand, the following steps are implemented:
deinterleaving $412_2$ of the output $L_{ext}(b_1)$, the deinterleaving $412_2$ implementing a deinterleaving function reverse of the interleaving function implemented in the interleaving step $304_2$;
demultiplexing $414_2$ to separate the $L_{priori}(a_2)$ and $L_{priori}(a_1)$ data.

The $L_{priori}(a_2)$ data correspond to the probabilities for each data bit of the class $102_2$ to be 0 or 1.

The $L_{priori}(a_1)$ data are used as a priori information in the following decoding step.

The demultiplexing $414_2$ is followed by a third decoding comprising a decoding step $410_1$ of the parity $P_1$, as a function of $L_{priori}(a_1)$ and the systematic output $5_3$ at which a deinterleaving $420_2$ and then $420_1$ has been applied, implementing a deinterleaving function reverse of the interleaving function implemented in the interleaving step $304_3$ respectively $304_2$, and the demultiplexing suitable for obtaining the systematic data of the class $a_1$.

The extrinsic data $L_{ext}(a_1)$ and an assessment $L_{soft}(a_1)$ of the data of the class $102_1$ are obtained.

The decoding method 400 has a feedback comprising the following steps:
interleaving $422_1$ of the $L_{ext}(a_1)$ and $L_{priori}(a_2)$ data, to obtain an interleaved datum $L'_{ext}(b_1)$, and implementing an interleaving function similar to the interleaving function implemented in the interleaving $304_2$ of the parallel encoding method 300;
interleaving $422_2$ of the $L'_{ext}(b_1)$ and $L'_{ext}(a_3)$ data, to obtain an interleaved datum $L_{priori}(b_2)$ and implementing an interleaving function similar to the interleaving function implemented in the interleaving $304_3$ of the parallel encoding method 300 ($L'_{ext}(a_3)$ being a datum of the size of $a_3$ but assuming zero values);
new iteration of the decoding step $410_3$, taking into account an a priori datum $L_{priori}(b_2)$;
new iteration of the steps following the decoding step $410_3$.

This feedback enables each class to benefit from the decoding accuracy obtained for the other classes.

Finally, the classes not much protected can be decoded with a better accuracy than if they had been encoded separately from better protected classes.

Described encodings use for example polynomial generators.

The sizes of the different processed classes can vary.

Some classes can be provided not to be encoded.

Figure 5:
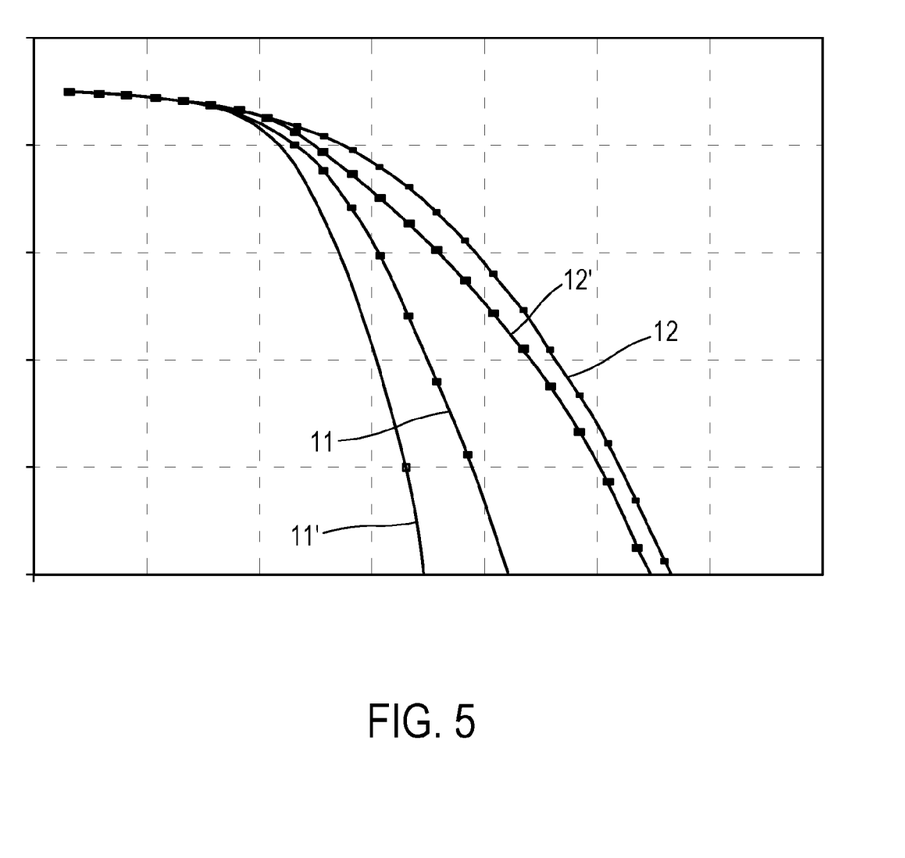
FIG. 5 illustrates bit error rate curves obtained with a decoding method according to the invention.

Bit error rate curves that can be obtained with a decoding method according to the invention are illustrated in FIG. 5.

The bit error rate is the number of erroneous bits in the assessments of the encoded data of a class, divided by the total number of bits analysed by the decoding method according to the invention. It is thus a quantity without unit.

The bit error rate is often expressed as a function of a signal to noise ratio. In FIG. 5, the abscissa axis corresponds to a bit error rate, the ordinate axis corresponds to the Eb/No ratio in dB, that is the ration in dB of an energy per bit to the power spectral density of the noise.

The example has been taken where:
after encoding, a QPSK (Quadrature Phase-Shift Keying) modulation has been implemented on a AWGN (Additive White Gaussian Noise) channel;
the frame 102 only comprises two encoded classes $102_1$ and $102_2$.

In FIG. 5, there is a ratio 2/3 between the size of the class $102_2$ less protected and the size of the frame, and a frame size of 900 bits.

The curve 11 represents the bit error rate associated with the decoding of the class $102_1$, upon the first iteration of the decoding step of the data of the class $102_1$.

The curve 12 represents the bit error rate associated with the decoding of the class $102_2$, upon the first iteration of the decoding step of the data of the class $102_2$.

The curve 11' represents the bit error rate associated with the decoding of the class $102_1$, upon the second iteration of the decoding step of the data of the class $102_1$.

The curve 12' represents the bit error rate associated with the decoding of the class $102_2$, upon the second iteration of the decoding step of the data of the class $102_2$.

Thereby, it can be seen that:
the class $102_1$, which is the first class that has been encoded, reaches upon the first iteration a very good bit error rate, since many redundancy information are available to retrieve the data of the class $102_1$;
the data of the class $102_1$ encoded in the first encoding step benefit from a decoding gain similar to that obtained in a turbo-type decoding upon the second iteration;
at the first iteration, the bit error rate associated with the data of the class $102_2$ is rather low, because there are only little redundancy information available to retrieve the data of the class $102_2$;
after an iteration, the bit error rate associated with the data of the class $102_2$ is remarkably improved, and is closer to the bit error rate obtained for decoding the data of the class $102_1$, benefiting in particular from the turbo decoding gain.

The influence of a more strongly encoded class on a less encoded class depends in particular on the ratio of the size of the first class to the size of the second class, in number of bits.

After five iterations, a bit error rate of $10^{-2}$ can for example be obtained for a signal to noise ratio lower than 2 dB, with a 2.5 dB gain between the first and the last iteration.

This property of the invention is particularly interesting, because it can be seen that each class benefits from the decoding accuracy obtained for the other classes and from the "turbo" effect.

Thus, a given class can be less protected than in prior art, for a given bit error rate.

It can then be seen that fewer redundancy data can be transmitted than in prior art, to obtain a given bit error rate.

Thus, the capacity of a transmission channel for a given coverage is increased.

Thus, the range of the transmission channel for a given capacity is increased.

Of course, the invention is not limited to the examples just described and numerous improvements can be provided to these examples without departing from the scope of the invention.

For example, any decoding type implementing in particular different feedback phases can be considered.

The invention can, for example, be combined with already existing techniques, for example with puncturing techniques, which consist in erasing bits of the already encoded frame to increase the coding ratio. In this case, the redundancy of the code for each class can be reduced.

The invention can also be combined with techniques of prior art consisting in separating data of a same frame, but each data packet gathering several classes and being apt to be processed according to the invention.

The invention claimed is:

1. An error correction encoding method for encoding in parallel source digital data, having the form of a frame, wherein said data can be classified into N classes, where n is an integer equal to at least 2, comprising:
a first recursive systematic convolutional encoding step of data to be encoded, formed by the data of the class 1; and
an implementation of the following steps, for each n ranging from 1 to M, where M is a positive integer equal to or lower than N−1:
$n^{th}$ mixing of a set formed by the data of the class n+1 and the systematic data of the preceding encoding; and
$(n+1)^{th}$ recursive systematic convolutional encoding of data to be encoded, formed by the result of the $n^{th}$ mixing.

2. The encoding method according to claim 1, characterised in that a priority level is assigned to each class, the classes 1 to N being ranked in the decreasing order of the priority level.

3. The encoding method according to claim 1, characterised in that each mixing step consists in an interleaving.

4. An encoding device for implementing a parallel error correction encoding method for encoding in parallel source digital data, having the form of a frame, wherein said data can be classified into N classes, where n is an integer equal to at least 2, including:
a first recursive systematic convolutional encoding step of data to be encoded, formed by the data of the class 1; and
an implementation of the following steps, for each n ranging from 1 to M, where M is a positive integer equal to or lower than N−1:
$n^{th}$ mixing of a set formed by the data of the class n+1 and the systematic data of the preceding encoding; and
$(n+1)^{th}$ recursive systematic convolutional encoding of data to be encoded, formed by the result of the $n^{th}$ mixing;
said device capable of encoding source digital data having the form of a frame, wherein said data being classified into N classes, and comprising:
a first recursive systematic convolutional encoding module configured for encoding data to be encoded formed by the data of the class 1; and
let n to range from 1 to M, wherein M is a positive integer equal to or lower than N−1, M sets each formed by a $n^{th}$ mixer followed by a (n+1)$^{th}$ recursive systematic convolutional encoding module, the n$^{th}$ mixer configured for receiving the data of the class n+1 and the systematic data of a preceding encoding module, and the (n+1)$^{th}$ encoding module configured for encoding data to be encoded formed by the output of the n$^{th}$ mixer.

5. A method for decoding digital data encoded according to a method comprising: encoding in parallel source digital data, having the form of a frame, wherein said data can be classified into N classes, where n is an integer equal to at least 2, comprising:
- a first recursive systematic convolutional encoding step of data to be encoded, formed by the data of the class 1; and
- an implementation of the following steps, for each n ranging from 1 to M, where M is a positive integer equal to or lower than N−1:
- n$^{th}$ mixing of a set formed by the data of the class n+1 and the systematic data of the preceding encoding;
- (n+1)$^{th}$ recursive systematic convolutional encoding of data to be encoded, formed by the result of the n$^{th}$ mixing; and
- further including decoding said encoded digital data encoded in accordance with the method according to claim 1.

6. The decoding method according to claim 5, characterised in that for any j, k, l between M+1 and 1:
- at each j$^{th}$ encoding step of the method according to claim 1, corresponds a decoding step j, configured for decoding encoded data resulting from the j$^{th}$ encoding step;
- at the end of each decoding step j, "soft" data are obtained for an assessment of the data of the class j, hand and extrinsic data are obtained;
- and in that the following steps are implemented:
- decoding k; and then
- decoding l≠k as a function of at least one extrinsic datum provided by at least one other decoding step, used as an a priori datum.

7. The decoding method according to claim 6, characterised in that it further comprises an initial demultiplexing step performing the separation of the parity data of each class.

8. The decoding method according to claim 6, characterised in that for j between M+1 and 2, after each decoding step j, the method further comprises the following operations:
- disentangling j−1 of said extrinsic data, the disentangling j−1 performing a function reverse to that implemented in the mixing step j−1, for providing disentangled data;
- demultiplexing the disentangled data to separate a priori data relating to the class j called extracted data from a priori data relating to the classes 1 to j−1 called useful a priori data; and
- providing said useful a priori data to be used in the decoding step j−1.

9. The decoding method according to claim 6, characterised in that for j between M+1 and 2, after each decoding step j, the method further comprises the following operations:
- disentangling j−1 of the soft data, the disentangling j−1 performing a function reverse to that implemented in the mixing step j−1, to provide disentangled soft data; and
- demultiplexing the disentangled soft data to separate soft data relating to the class j called extracted soft data from soft data relating to the classes 1 to j−1.

10. The decoding method according to claim 6, characterised in that at least one decoding step j is reiterated at least once, as a function of a priori data corresponding to extrinsic data provided by at least one decoding step of the data of another class.

11. The decoding method according to claim 10, characterised in that for j between M+1 and 2 and t strictly lower than j, the decoding step j is reiterated as a function of a priori data obtained in the decoding steps t to j−1.

12. The decoding method according to claim 11, characterised in that a decoding phase comprises the following steps:
- the decoding step M+1 is reiterated as a function of a priori data obtained in the decoding steps 1 to M;
- the decoding steps M to 1 are reiterated using a priori data corresponding to extrinsic data provided by the preceding decoding step, so that the decoding steps M+1 to 1 make up a decoding phase; and
- and in that the decoding phase is reiterated at least once.

13. The decoding method according to claim 10, characterised in that for j between M and 1 and t strictly higher than j, the decoding step j is reiterated as a function of a priori data obtained in the decoding steps t to j+1.

14. A decoding device configured for implementing a decoding method for decoding data encoded according to a method comprising: encoding in parallel source digital data, having the form of a frame, wherein said data can be classified into N classes, where n is an integer equal to at least 2, comprising:
- a first recursive systematic convolutional encoding step of data to be encoded, formed by the data of the class 1; and
- an implementation of the following steps, for each n ranging from 1 to M, where M is a positive integer equal to or lower than N−1:
- n$^{th}$ mixing of a set formed by the data of the class n+1 and the systematic data of the preceding encoding;
- (n+1)$^{th}$ recursive systematic convolutional encoding of data to be encoded, formed by the result of the n$^{th}$ mixing; and
- further including decoding said encoded digital data,
- said device comprising: M+1 decoding modules, each decoding module j being capable of decoding encoded data resulting from the j$^{th}$ encoding step of the method according to claim 1, and each decoding module j providing extrinsic data capable of being used as a priori data by another decoding module, and at least one "soft" datum for an assessment of the data of the class j.

* * * * *